United States Patent
Koike-Akino et al.

(10) Patent No.: US 9,749,163 B2
(45) Date of Patent: *Aug. 29, 2017

(54) SYSTEM AND METHOD FOR LINEARIZING POWER AMPLIFIERS

(71) Applicant: Mitsubishi Electric Research Laboratories, Inc., Cambridge, MA (US)

(72) Inventors: Toshiaki Koike-Akino, Malden, MA (US); Qiuyao Zhu, Chicago, IL (US); Rui Ma, Somerville, MA (US); Koon Hoo Teo, Lexington, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/995,773

(22) Filed: Jan. 14, 2016

(65) Prior Publication Data
US 2016/0134446 A1 May 12, 2016

Related U.S. Application Data

(63) Continuation of application No. 14/444,022, filed on Jul. 28, 2014, now Pat. No. 9,270,504.

(51) Int. Cl.
*H03K 7/08* (2006.01)
*H03K 9/08* (2006.01)
(Continued)

(52) U.S. Cl.
CPC ....... *H04L 25/4902* (2013.01); *H03F 1/3247* (2013.01); *H03F 3/2178* (2013.01);
(Continued)

(58) Field of Classification Search
CPC ....... H03F 3/217; H03F 2200/331; H03F 1/32
(Continued)

(56) References Cited

U.S. PATENT DOCUMENTS

| | | | |
|---|---|---|---|
| 7,825,724 B2 | 11/2010 | Cygan et al. | |
| 2003/0112063 A1* | 6/2003 | Kenington | H03F 1/0227 330/10 |

(Continued)

FOREIGN PATENT DOCUMENTS

| | | |
|---|---|---|
| EP | 2063536 | 5/2009 |
| EP | 2575309 | 4/2013 |

OTHER PUBLICATIONS

Qiuyao Zhu et al: "A 5-level discrete-time power encoder with measured coding efficiency of 70% for 20-MHz LTE Digital transmitter," 2014 IEEE MTT-S International Microwave Symposium (IMS2014), IEEE, Jun. 1, 2014 (Jun. 1, 2014), pp. 1-3, XP032615417.

(Continued)

*Primary Examiner* — Sam K Ahn
*Assistant Examiner* — Fabricio R Murillo Garcia
(74) *Attorney, Agent, or Firm* — Gene Vinokur; James McAleenan; Hironori Tsukamoto

(57) ABSTRACT

A power encoder includes a pulse width modulator for modulating a signal according to a set of thresholds to produce a pulse width modulated (PWM) signal and a switch mode power amplifier for amplifying the PWM signal by switching states of switching devices according to amplitudes of the PWM signal. At least one or combination of a distribution of values of the voltage thresholds in the set and a distribution of values of a current generated by different switching devices are non-uniform. The set of voltage thresholds includes at least two positive voltage thresholds.

20 Claims, 13 Drawing Sheets

(51) Int. Cl.
*H04L 25/49* (2006.01)
*H03F 1/32* (2006.01)
*H03F 3/217* (2006.01)
*H03F 3/24* (2006.01)
*H04B 1/04* (2006.01)

(52) U.S. Cl.
CPC ............ *H03F 3/24* (2013.01); *H04B 1/0475* (2013.01); *H04L 25/4917* (2013.01); *H03F 2200/351* (2013.01); *H03F 2201/3233* (2013.01); *H04B 2001/0425* (2013.01)

(58) Field of Classification Search
USPC .................... 375/238, 295; 330/251, 10, 277
See application file for complete search history.

(56) References Cited

U.S. PATENT DOCUMENTS

| | | |
|---|---|---|
| 2003/0210746 A1 | 11/2003 | Asbeck et al. |
| 2006/0188027 A1 | 8/2006 | Jeckeln et al. |
| 2009/0273396 A1* | 11/2009 | Nam .................. H03F 3/217 330/10 |
| 2010/0029229 A1* | 2/2010 | Schaefer ............... H03F 1/0205 455/127.2 |
| 2011/0267127 A1* | 11/2011 | Staszewski ........... H03F 3/2176 327/306 |
| 2013/0223651 A1* | 8/2013 | Hoyerby ............... H03F 3/2173 381/120 |
| 2013/0235923 A1* | 9/2013 | Schuberth ................ H03K 7/08 375/238 |
| 2013/0268122 A1* | 10/2013 | Desai ..................... G05B 15/02 700/275 |
| 2014/0063884 A1* | 3/2014 | Itoh ....................... H02M 7/487 363/132 |

OTHER PUBLICATIONS

Albert Garcia I Tormo et al: "Multi-Level asynchronous [Sigma] [Delta] modulators for wideband switching power amplifiers," Control and Modeling for Power Electronics (COMPEL), 2010 IEEE 12th Workshop on, IEEE, Piscataway, NJ, USA, Jun. 28, 2010 (Jun. 28, 2010), pp. 1-8, XP031746267.

* cited by examiner

SYSTEM AND METHOD FOR LINEARIZING POWER AMPLIFIERS

RELATED APPLICATION

This application is related to co-pending U.S. patent application Ser. No. 14/063,518 entitled "Digital power encoder for direct digital-RF transmitter," filed by Ma et al. on Oct. 25, 2013, and to U.S. patent application Ser. No. 14/063,543 entitled "System and Method for Linearizing Power Amplifiers," filed by Ma et al. on Oct. 25, 2013 and incorporated herein by reference.

FIELD OF THE INVENTION

The present invention relates generally to linearization of power amplifiers, and more particularly to the linearization of a multi-level digital pulse-width-modulation encoder.

BACKGROUND OF THE INVENTION

A direct digital radio frequency (RF) transmitter (TX) has several advantages compared to the digital-analog-RF transmitters. The direct digital-RF transmitter arranges the digital-analog interface close to the antenna, and thus fewer analog components are involved. Typical analog issues like In-phase (I) and Quadrature-phase (Q) signals mismatch, local oscillator leakage, and image distortion can be largely alleviated and even avoided. The direct digital-RF transmitter also enhances system flexibility through multi-mode and multi-band operation enabled by the agile digital signal processing. In addition, the direct digital-RF transmitter is digital friendly in nature, taking advantage of the increasing speed and density of digital processing as well as high-level integration. Thus, the direct digital-RF transmitters have benefits for both wireless base-station and mobile applications.

The direct digital-RF transmitter includes a switching mode power amplifier (SMPA), such as a class-D or class-S power amplifier, employing a particular power coding scheme, such as DSM (delta sigma modulation), PWM (pulse width modulation) and PPM (pulse position modulation) in addition with a reconstruction band-pass filter (BPF).

In order to meet the stringent linearity requirement of modern wireless communications system, most of the conventional SMPA-type transmitters use DSM as the power encoder. Examples of such modulators include band-pass delta-sigma modulation (BPDSM) based class-S power amplifiers. See, e.g., U.S. 2003/0210746, U.S. 2006/0188027, EP 2063536, and U.S. Pat. No. 7,825,724. The DSM is a noise shaping function with feedback loops, which can increase the in-band noise to the out-of-band spectrum. The in-band signal-to-noise ratio (SNR) can be greater than 60 dB.

Although the high in-band SNR is desired, the near band quantization noise can increase abruptly. Therefore, an extremely high quality factor (Q) for BPF is required to let the filtered RF signal meet the spectrum emission mask. Furthermore, the DSM based direct digital-RF transmitter can cause the overall power inefficiency, due to the low power coding efficiency of the power encoder.

In terms of power, the RF power amplifier (PA) consumes the most energy in the transmitter. A main advantage of this transmitter is that the SMPA is always between ON (saturated) and OFF (cut-off) operating region, achieving high peak efficiency. However, if non-constant envelope signals, which are common for $3^{rd}$ generation (3G) and $4^{th}$ generation (4G) cellular mobile communications systems, are encoded into the single bit digitized signals, the in-band power over the entire digitized signal power, defined as the power coding efficiency, is low, because the generation of quantization noise is inevitable and widely spread throughout the frequency domain due to the noise shaping function, which is required from the system linearity specification. Because this noise signal is also amplified by the SMPA, the unwanted noise power becomes wasteful, which causes both excessive power loss and total TX efficiency degeneration.

The low power coding efficiency comes from the noise shaping in delta sigma power coding scheme. Alternatively, some conventional coding schemes use various PWM techniques to address the power coding efficiency. For example, some new high-efficiency power coding schemes based on the PWM include RFPWM and 3-level polar PWM architecture. Because of the inherent nonlinearity of the PWM quantization, the linearity performance degrades in the encoder. Both power coding schemes are built with analog high-speed comparators, which use the higher frequency of triangular or saw-tooth waveform as the reference signal to be compared.

EP2575309 discloses a pre-emphasis linearization block for a 3-level PWM power coding scheme. The pre-emphasis block uses an inverse function of the transfer function of the RFPWM power coding. The output of the pre-emphasis block is submitted to the input of the RFPWM encoder. Ideally, the pre-emphasis can correct the nonlinearity by the RFPWM encoder. However, this is possible only when the inverse function exists and can be analytically derived.

For example, the system of EP2575309 uses relatively simple 3-level PWM, so the inverse function can be determined. However, for more than 3-level, e.g., 5-level RFPWM encoding, the transfer function can become so complicated that no solution can be derived for its inverse function, which leads the difficulty to build the pre-emphasis block. Therefore, this method is not suitable for high frequency transmissions requiring complex encoding.

Hence, there is a demand for a new linearization method, particularly for the high power coding efficiency power encoder.

SUMMARY OF THE INVENTION

One objective of some embodiments of the invention is to compensate for the non-linearity of the direct digital-RF transmitter, e.g., to meet the specification for wide bandwidth high peak-to-average power ratio (PAPR) wireless communications signals.

Some embodiments of the invention are based on recognition that uniform distribution of values of the voltage thresholds used by a pulse width modulator (PWM) for modulating a signal limits capability of modulator to compensate for non-linearity of the signal and high-frequency noise. Some embodiments based on further realization and corresponding justification that the power coding efficiency depends not only on statistical property of the signal, but also on ratio of positive or negative voltage thresholds. For example, in some embodiments, a ratio of two voltage thresholds is between 0.3 and 0.4. In one embodiment, the ratio is 0.35.

Some embodiments of the invention are based on another recognition that, additionally or alternatively to the non-uniform distribution of voltage thresholds, a non-uniform distribution of values of a current generated by different switching devices of a switch mode power amplifier (SWPA) for amplifying the modulated signal can also improve the efficiency of the power encoder. For example, in some embodiments, the modulated signal is a multi-level PWM signal and the ratio of the current generated for one level of the modulated signal to the current generated for the next level of the modulated signal is between 0.2 and 0.4 inclusively.

One embodiment uses both non-uniform distributions of the voltage thresholds and generated currents. The embodiment provides a way to optimize the voltage and current distributions as well as pre-emphasis linearization, and improves the power coding efficiency by more than 5%.

Accordingly, one embodiment of the invention discloses a power encoder including a pulse width modulator for modulating a signal according to a set of thresholds including at least two positive voltage thresholds to produce a pulse width modulated (PWM) signal; and a switch mode power amplifier for amplifying the PWM signal by switching states of switching devices according to amplitudes of the PWM signal, wherein at least one or combination of a distribution of values of the voltage thresholds in the set and a distribution of values of a current generated by different switching devices are non-uniform.

Another embodiment discloses a method for power encoding including modulating a signal according to a set of thresholds including at least two positive voltage thresholds to produce a pulse width modulated (PWM) signal; and amplifying the PWM signal by switching states of switching devices according to amplitudes of the PWM signal, wherein at least one or combination of a distribution of values of the voltage thresholds in the set and a distribution of values of a current generated by different switching devices are non-uniform.

DETAILED DESCRIPTION OF THE PREFERRED EMBODIMENTS

Advanced switch-mode power amplifiers (SMPAs), e.g. class-S amplifiers, have become one of the key power amplifier architectures. The benefits of high theoretical power efficiency and operational flexibility can enable next generation direct digital-radio frequency (RF) transmitter (TX) in mobile communications systems like software-defined radio (SDR).

The direct digital-RF transmitter utilizes class-S amplifiers to amplify a high-speed pulse-train generated via a power encoder, like delta sigma modulator (DSM), pulse width modulator (PWM), or pulse position modulator (PPM). Usually a high-Q (>500) bandpass filter (BPF) is used to reconstruct the signal back to analog RF. Notably, with the recent advancement of Gallium nitride (GaN) RF transistor technology, this architecture is gaining more attention, in particular for pico-/macro-base station cellular applications.

The pulse width modulators (PWM) are used for highly efficient switching power amplifiers, which are used for the amplification of radio signals to be transmitted over an air interface in a wireless or wired communications network. In principle, the PWM allows for an ideal conversion of signals with continuous amplitude and limited bandwidth to a time continuous signal.

However, the PWM are inherently nonlinear, which results in the distortion of the modulated signal. Thus, in order to maintain the required integrity/linearity of the signals, especially for suppressing the in-band noise floor and out-of-band image replicas, some embodiments of the invention pre-distort the data signal before its quantization.

Figure 1A:
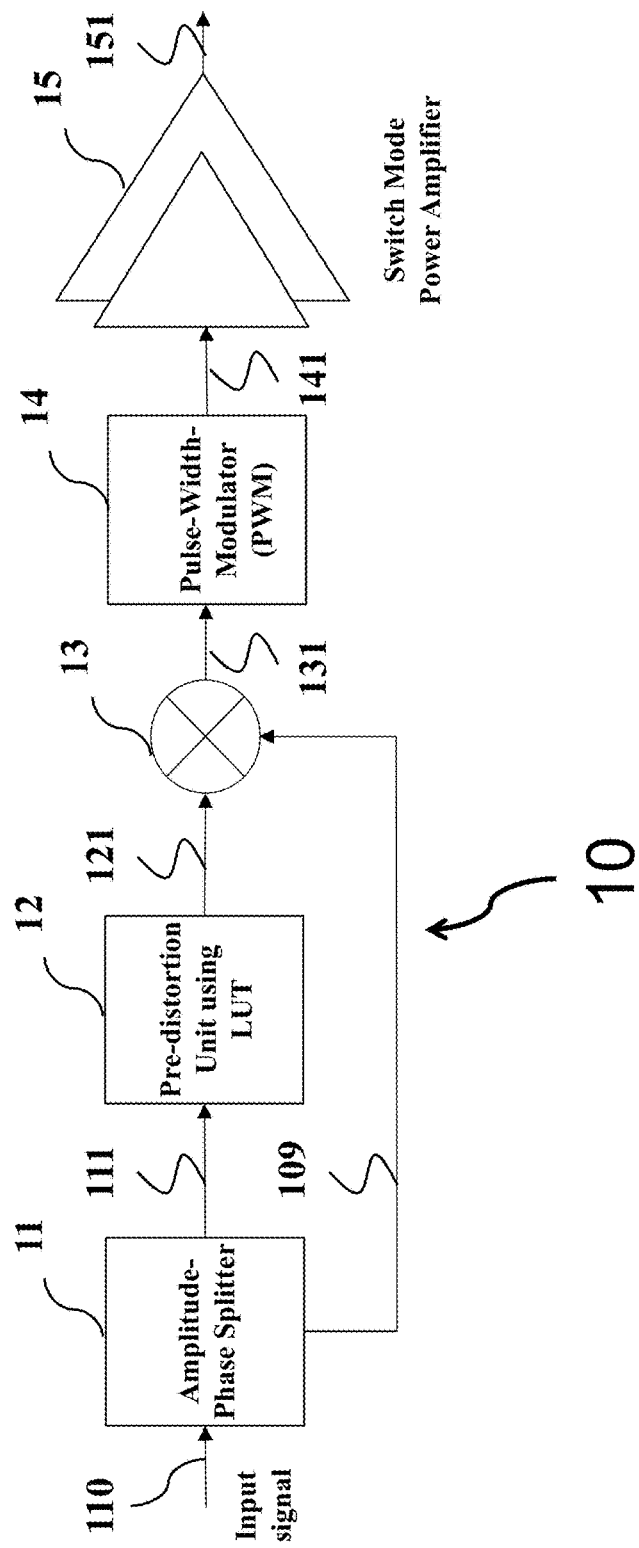
FIG. 1A is a block diagram of a power encoder employing linearization according to some embodiments of the invention.

FIG. 1A shows a schematic 10 of power encoder with pre-emphasis linearization according to some embodiments of the invention. An amplitude-phase splitter 11 splits an input signal 11 into an envelope signal 111 and a phase modulated signal 109. The envelope signal 111 represents amplitudes of the input signal, and the phase-modulated signal 109 represents phases of the input signal. A pre-distortion unit 12 distorts the envelope signal 111 using a look-up table (LUT) to produce a distorted envelope signal 121.

Some embodiments of the invention are based on recognition that a transformation function of PWM is nonlinear, but the input signal, e.g., an envelope signal, has to be mapped linearly by the power encoder. Furthermore, the nonlinearity of the mapping depends on the transformation function and cannot always be determined analytically.

Some embodiments are based on a realization that the nonlinearity of the mapping can be determined experimentally by applying the transformation function to the input data and building a mapping, e.g., LUT, between the data inputted to the power encoder and the data outputted by the power encoding. It was further realized that it is possible to pre-distort the input data based on the predetermined non-linearity mapping, such that the transformation function of PWM transforms the pre-distort data to the value linear to the input data. To that end, the LUT stores a non-linear mapping of a transformation function used by PWM 14 for the modulation, as described in more details below.

Because only amplitudes of the input signal have to be corrected, a digital converter 13 combines the distorted envelope signal 121 with the phase modulated signal 109 to produce a distorted input signal 131. Next, the PWM 14 modulates the distorted input signal according to the transformation function to produce a modulated signal 141 and an SMPA 15 amplifies the modulated signal 141 to produce a power encoded signal 151. A relationship between the distorted input signal and the modulated signal is non-linear. However, because the distorted input signal was distorted based on the transformation function of the PWM, the relationship between the original input signal and the modulated signal becomes substantially linear.

In one embodiment, the PWM is a radio frequency (RF) PWM (RFPWM), and the digital converter up-converts the distorted envelope signal and the phase modulated signal with an RF carrier signal, such that the modulated signal is an RF pulse train. In alternative embodiment, the PWM is an intermediate frequency (IF) PWM (IFPWM), and the digital converter up-converts the distorted envelope signal and the phase-modulated signal with an IF carrier signal, such that the modulated signal is an IF pulse train. This embodiment can also include a second digital up-converter for converting the IF pulse train to an RF pulse train and for submitting the RF pulse train to the SMPA.

Figure 1B:
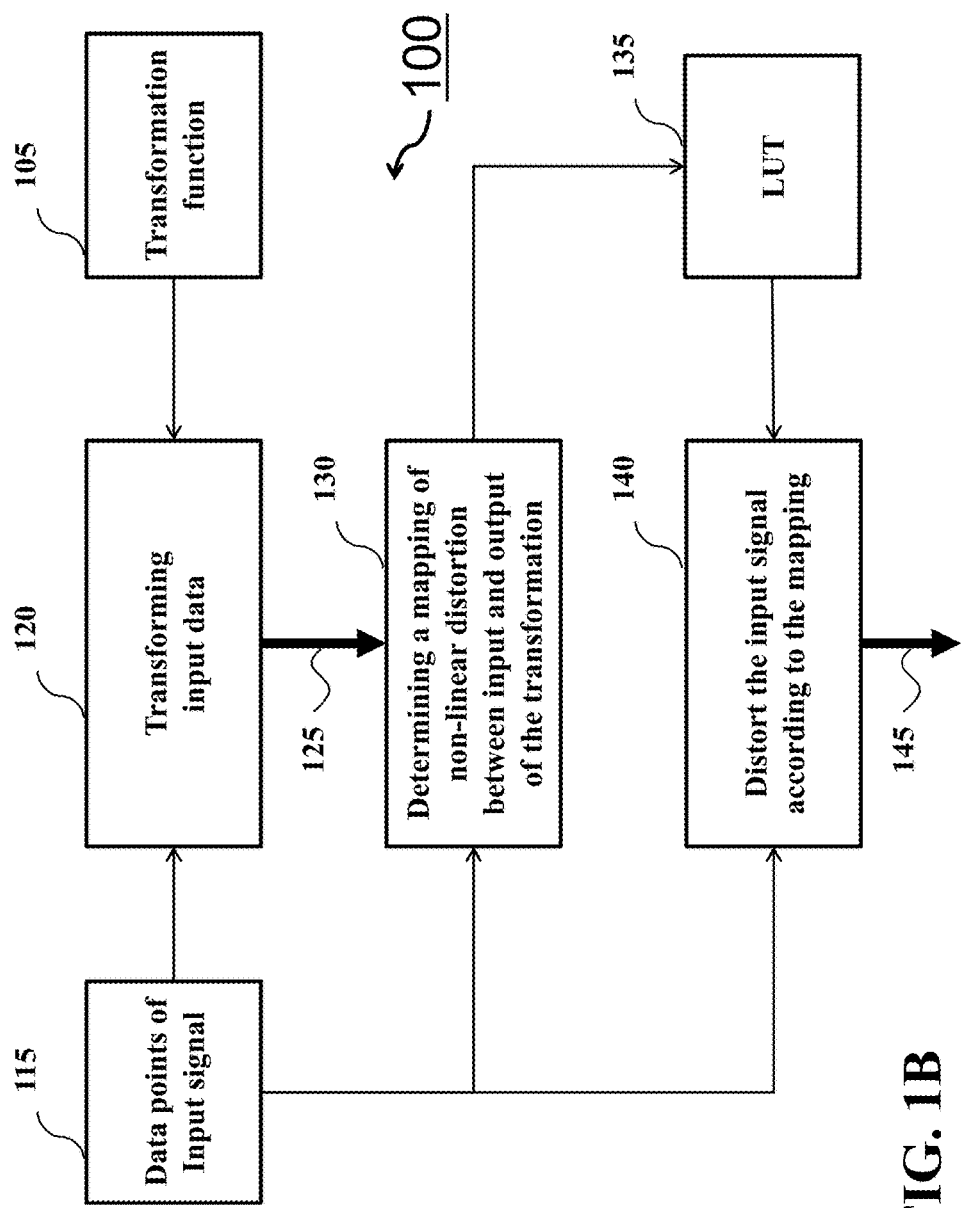
FIG. 1B is a block diagram of a pre-emphasis linearization method according to some embodiments.

FIG. 1B shows a block diagram of a pre-emphasis linearization method according to some embodiments. The method can be performed by a processor 100. The mapping, e.g., the LUT 135, is determined 130 using a forward mapping by applying the transformation function to a set of input data points. For example, the processor applies 120 the transformation function 105 to the set of data points 115 of the input to produce output data 125. The transfer function can be the amplitude-to-amplitude (AM-AM) transfer function. The LUT 135 is determined 130 as a mapping between the input 110 and the output 125 of the transformation.

In contrast, the distorted data is determined by a backward mapping of the data point of the envelope signal by selecting 140 using the LUT 135 an input to the transformation function corresponding to an output of the transformation function that is equal to the data point of the envelope signal.

For example, the input data received for processing by the power encoder are distorted 140 using the LUT 135 to produce the distorted data. The distorted data 145 is subsequently encoded by the power encoder to produce encoded data, that are linear with the input data. The backward mapping is performed for a set of data points of the input signal, such that each data point of the distorted input signal 145 equals to an input to the transformation function corresponding to an output of the transformation function that is equal to the data point of the input signal.

Figure 1C:
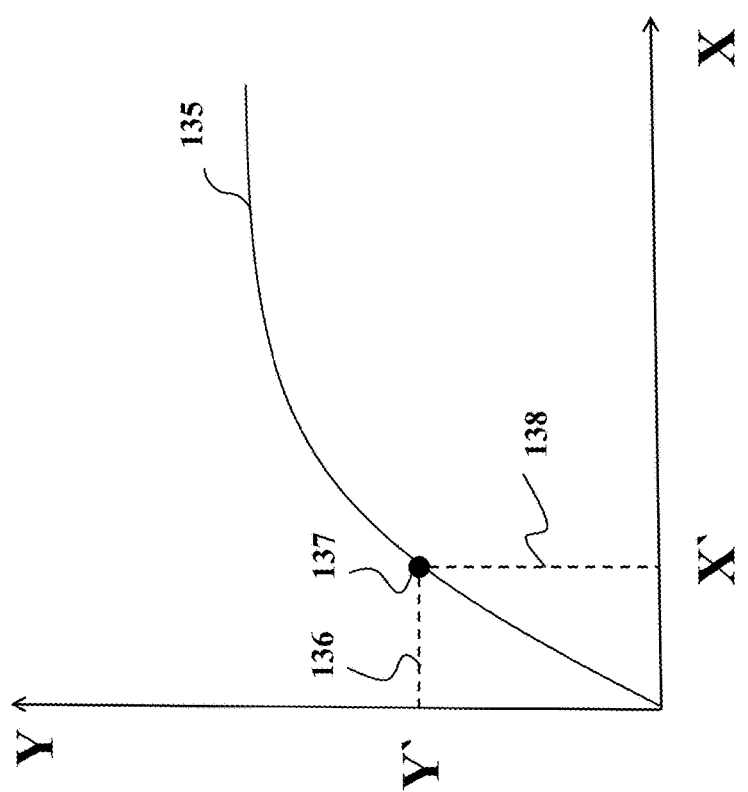
FIG. 1C is an example of a linearization mapping according to one embodiment.

FIG. 1C shows an example of the backward mapping using the LUT 135 according to one embodiment. The LUT 135 maps the input X with the output Y of the transformation. Various embodiments of the invention use the LUT 135 to pre-distort the input signal before the power encoding. For example, the data point y' 136 of the envelope signal is mapped 137 to the value x' 138. The value 138 is the pre-distorted value of the corresponding data point of the distorted envelope signal and is modulated with an aim to produce the linear mapping between the data point 136 of the envelope signal and the corresponding point of the modulated signal.

Figure 2:
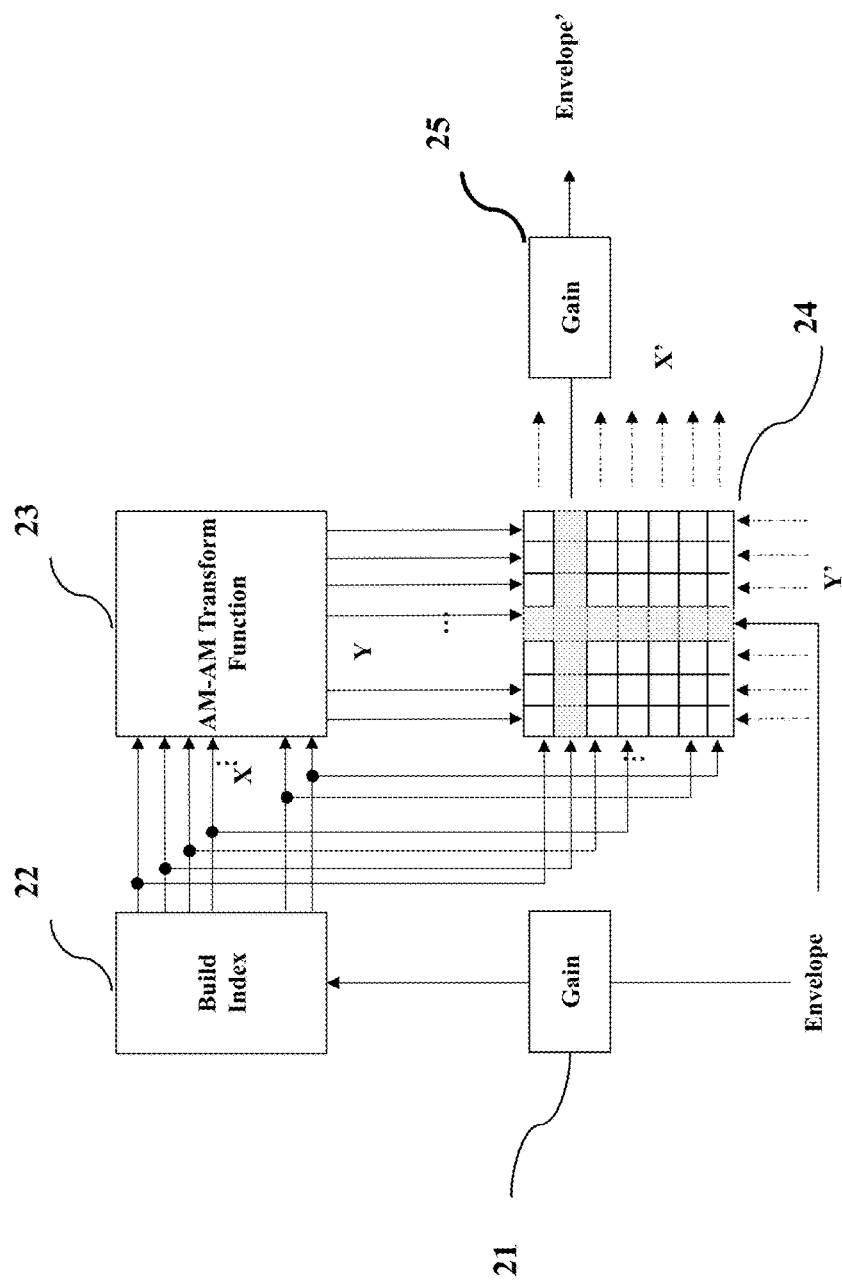
FIG. 2 is a block diagram of building and searching look-up table.

FIG. 2 illustrates a diagram of a method for determining the LUT 24 according to some embodiments of the invention. In some embodiments the LUT 24 is determined adaptively for each portion of the input signal, e.g., a frame. In order to build the LUT 24, the AM-AM transfer function 23 of the multi-level quantizer needs to be derived first. For a general (2N+1)-level quantizer, the amplitude-to-amplitude (AM-AM) transfer function can be $$f(a(t)) = \frac{1}{N}\sum_{i=1}^{N}\cos\left[\sin^{-1}\left(\frac{V_{thi}}{a(t)}\right)\right], \; a(t) \geq V_{thN} \quad (1)$$

where $a(t)$ is the envelope of the input data, and $V_{thi}$ is the $i^{th}$ threshold value, $V_{thi} < V_{thj}$ when $1 \leq i < j \leq N$.

Next, the embodiments index the discrete LUT. The output vector Y is the result calculated from the AM-AM function with the defined input vector X, e.g., from $V_{th1}$ to 1 with the fixed step, e.g. 0.001. This procedure is accomplished by building the index 22 after the normalization 21 of the envelope. Now, the LUT 24 is reversely searched with the envelope input Y' to select the closest pre-distorted output X'. Another gain block 25 can re-normalize the pre-distorted output to be the input of the following power encoder.

The LUT 24 can be composed to describe the inverse behavior of the nonlinearity of the encoder, which is described in Equation (1). Pre-distortion procedure can be imposed according to the searched LUT value. This LUT searching algorithm has in theory no limitation on the number of quantization level, which is an advantage over the analytical inverse function based pre-distortion scheme.

Figure 3:
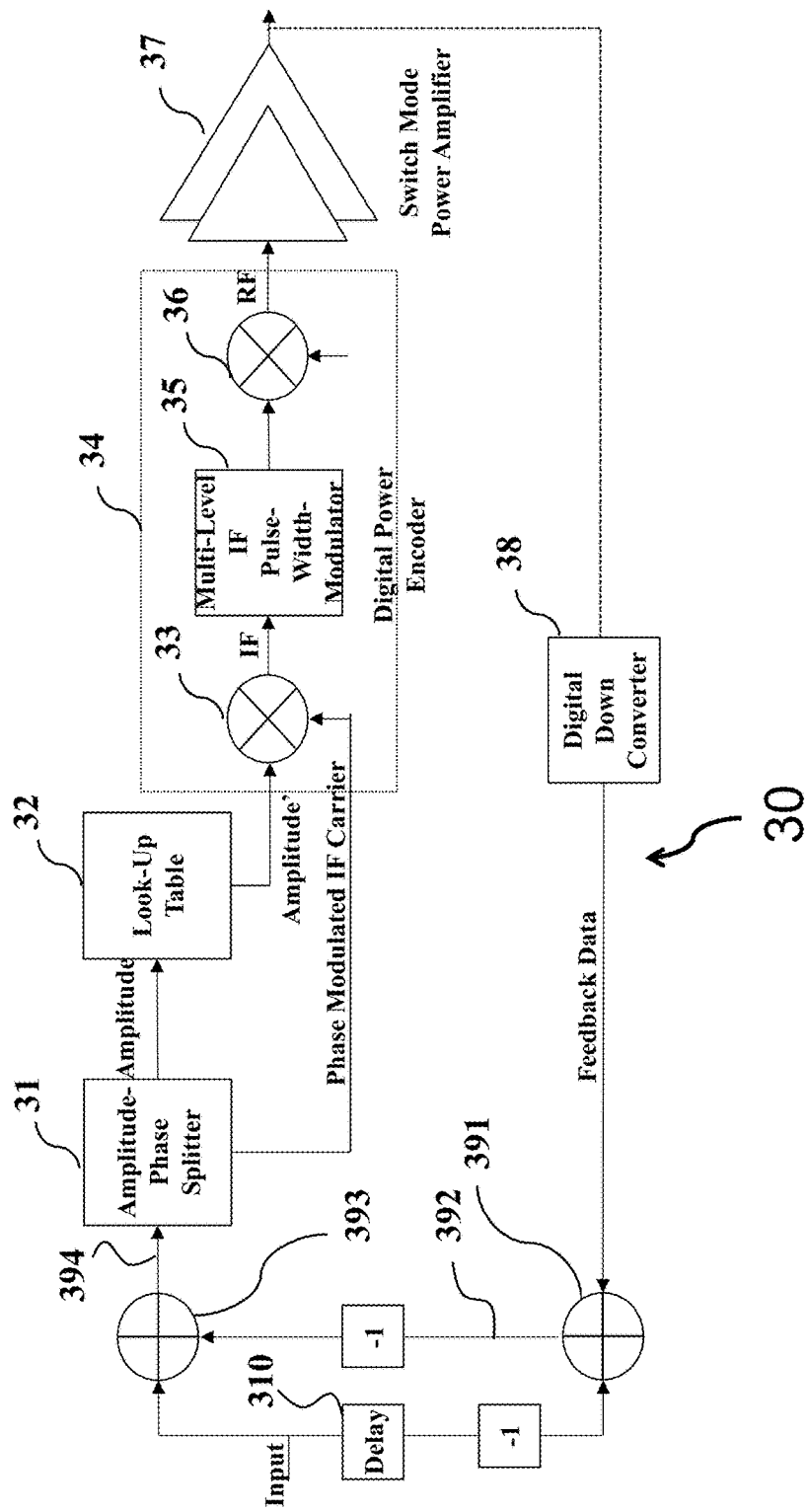
FIG. 3 is a circuit schematic of this direct digital-RF transmitter linearization method based on look-up table as depicted in FIG. 2.

FIG. 3 shows a block diagram of a method for considering SMPA nonlinearity according to an embodiment of this invention. A direct digital-RF transmitter linearization method 30 includes the linearization of both multi-level power encoder 35 and SMPA 37. A primary portion of this transmitter distortion correction is realized by the high speed digital logic integrated circuit (preferably application-specific integrated circuit: ASIC), which includes two adders 39, amplitude-phase splitter 31, LUT 32, digital encoder 34, and digital down converter (DDC) 38. Within the digital encoder 34, there are two frequency up-converters 33 and 36, and a multi-level IFPWM (ML-IFPWM) 35.

Some embodiments of the invention are based on a realization that by decreasing the PWM input carrier to an IF, and then encoding the IF signals by a PWM, the time-domain quantization is extended and a magnitude of the quantization increased. Thus, the accessible clock rate of current digital processors can implement this power coding algorithm and the direct digital output to SMPA becomes realizable.

The first up-converter 33 converts the pre-distorted envelope to an IF, and then feeds the ML-IFPWM 35. The encoded result is further up-converted to RF by the second up-converter 36. In the preferred embodiment transmitter 30, the power amplifier 37 is a switching power amplifier (preferably class-S PA module) that accepts a multi-level pulse train as an input, and amplifies the high-speed pulse train signal including the necessary in-band information.

Part of the SMPA 37 output is coupled and digitized back to the digital down converter (DDC) 38, which down-converts the RF signal back to the baseband as the feedback data. The input data can be aligned with the feedback through a delay block 310. The lower combiner 391 determines the error data 392 that are subtracted from the input data in advance by the upper combiner 393 to produce the corrected data 394. This feedback loop corrects the distortion of the SMPA 37. The envelope of the corrected data is calculated by the amplitude-phase splitter 31 (preferably a coordinate rotation digital computer: CORDIC). The block LUT 32 pre-distorts the envelope to correct the distortion of the ML-IFPWM 35.

Figure 4A:
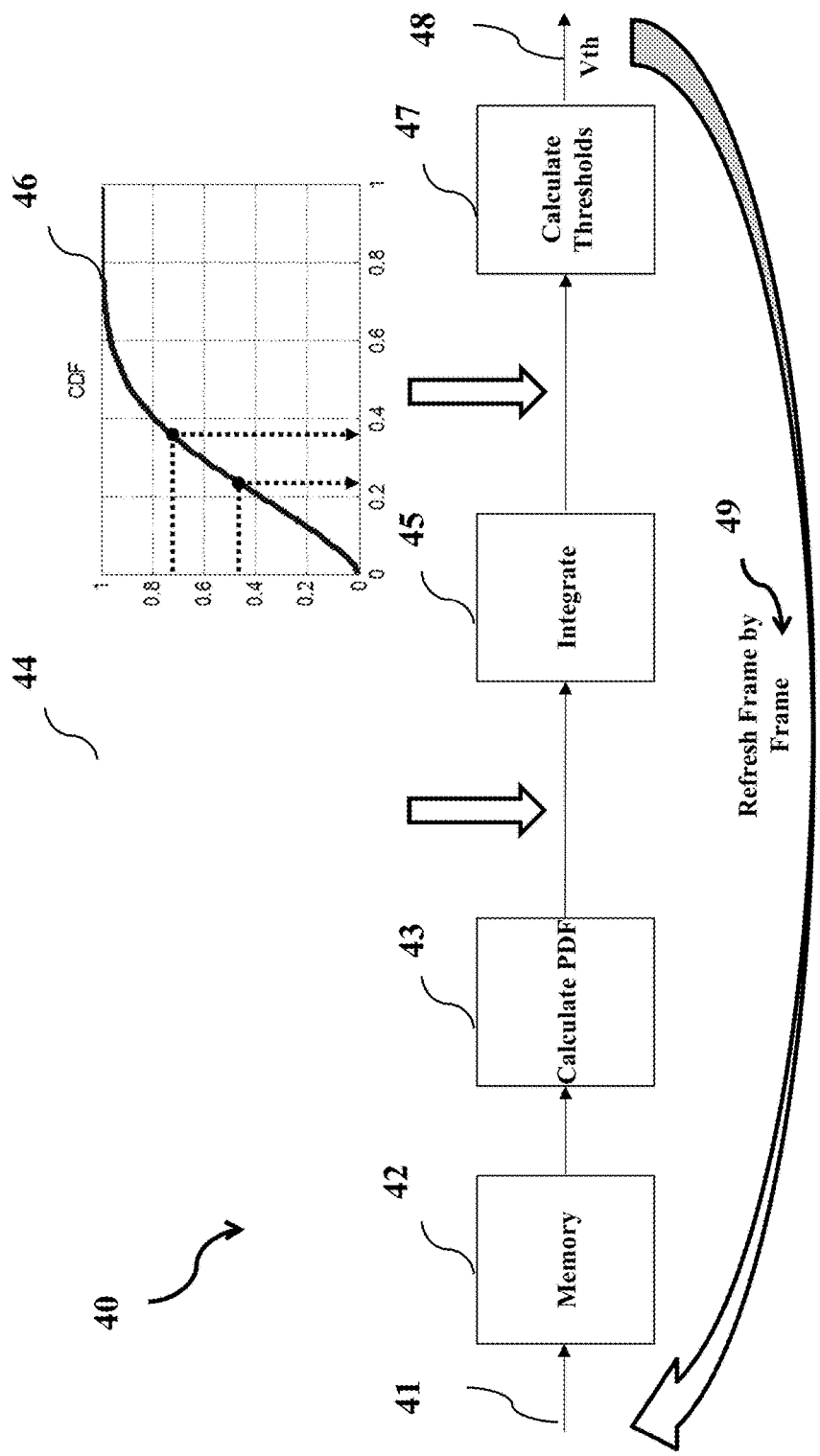
FIG. 4A is a schematic of determining the set of fixed thresholds according to some embodiments of the invention.

FIG. 4A shows a schematic of a method for determining the set of fixed thresholds, which is adaptive to each transmitted frame or subframe according to some embodiments of the invention. The method can be implemented by a processor 40 connected to a memory 42. The baseband input data 41 of a frame are stored in a memory 42 as vectors or arrays. Then, the processor 40 determines 43 the probability density function (PDF) 44 from data in the frame. The PDF is integrated 45 to generate a curve 46 of the cumulative distribution function (CDF). From the CDF curve 46, a set of threshold values 48 are selected, e.g., the CDF curve is equally spaced. This process is adaptively repeated 49 frame by frame to ensure the set of thresholds 48 remains optimal.

Figure 4B:
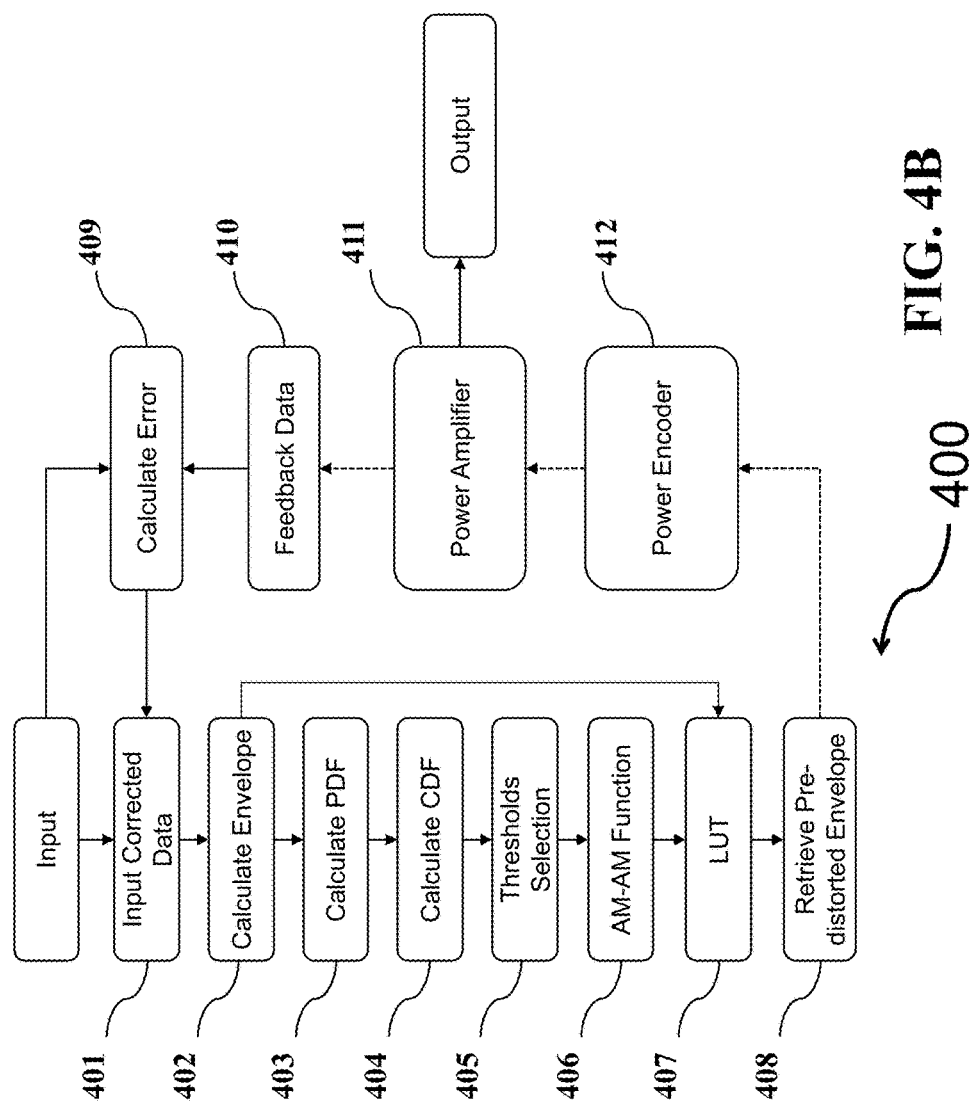
FIG. 4B is a flow chart of this direct digital-RF transmitter linearization method.

FIG. 4B shows a flow chart 400 of the linearization method according to another embodiment of the invention. The embodiment determines 401 the corrected data by subtracting the input data and the error 409 determined using a feedback 410 and extracts 402 the envelope of the corrected data. The PDF 403 and the CDF 404 of the envelope are determined. Given the CDF, a set of threshold values for each quantization levels is selected 405 from the CDF curve. The AM-AM transfer function 406 and the LUT 407 are determined as described above, and used to pre-distort 408 the envelope of the input data through searching the LUT 407. The steps are adaptively repeated frame-by-frame to ensure that the power coding efficiency is always optimized. The power encoder 412 encodes the pre-distorted data and output to the power amplifier 411 for transmitting. A small portion of power can also be fed back 410 to calculate the distortion error due to the power amplifier 411.

Figure 5:
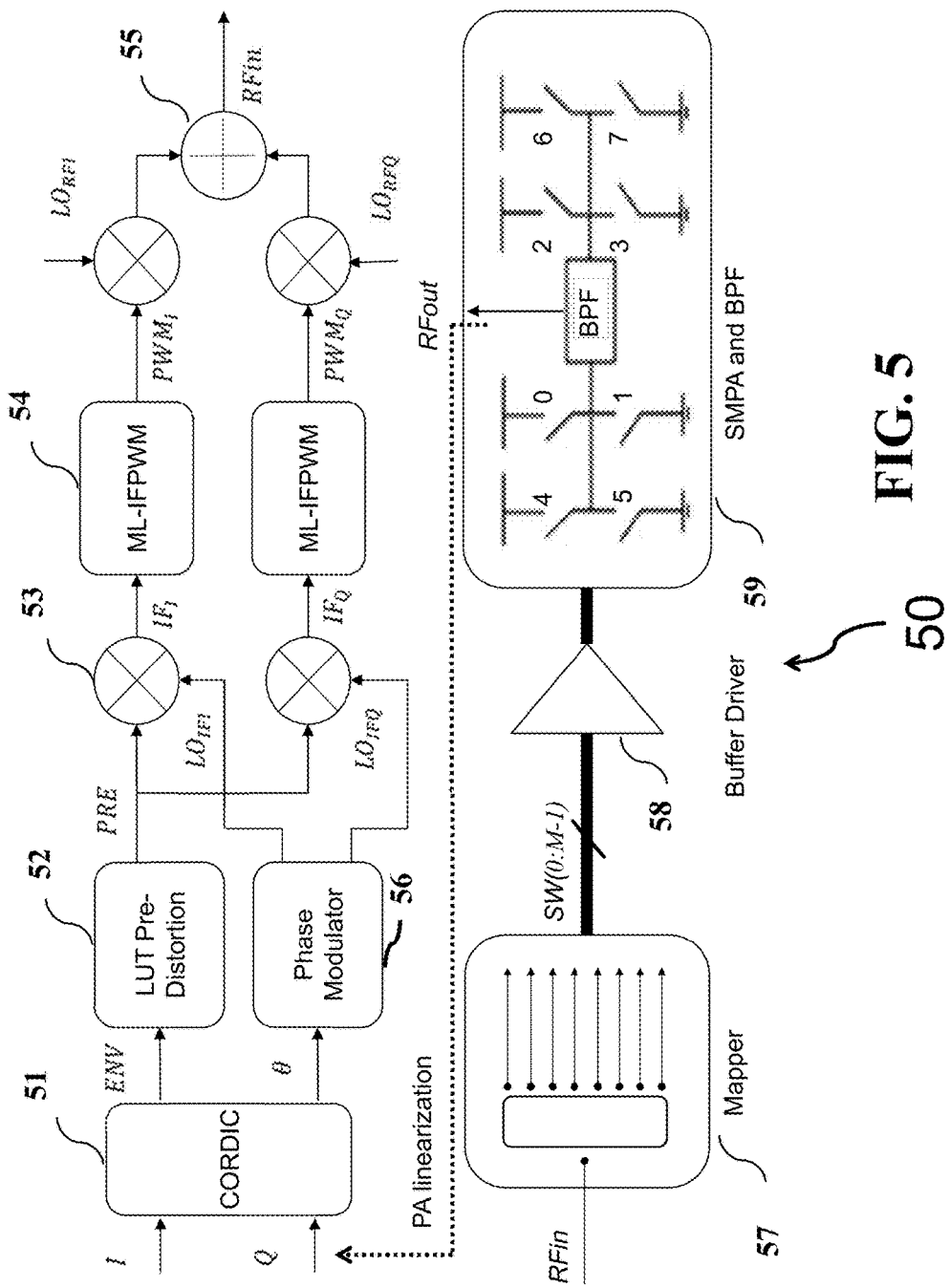
FIG. 5 is a block diagram of the direct digital-RF transmitter according to some embodiments of the invention.

FIG. 5 shows a block diagram of the direct digital-RF transmitter 50 according to some embodiments. In these embodiments, a pre-distortion block based on a LUT is arranged before the encoder to further compensate for the non-linearity. After the encoder, a 4-phase LO is employed to up-convert the IF IQ signal into RF band. Hence, this embodiment is a two-stage digital up-conversion at a reduced sampling rate. Because this is a pipeline architecture, the embodiments can use a parallel implementation to increase the sampling rate for higher time domain quantization to achieve the desired linearity.

The input data are complex and includes both In-phase (I) and Quadrature-phase (Q) paths. The complex input is processed by a coordinate rotation digital computer (CORDIC) block 51 to convert the Cartesian data to polar data (i.e., envelope (ENV) and phase θ). A LUT pre-distortion unit 52 is enabled to pre-distort the ENV for linearity correction of the nonlinear ML-IFPWM 54 power encoder. The output is noted as PRE. The phase modulator 56 generates the phase modulation (PM) IQ signal ($LO_{IFI}$ and $LO_{IFQ}$) at the IF carrier frequency (e.g., 100-MHz for LTE application). Two IF digital up-converters (DUCs) 53 mix the PRE with $LO_{IFI}$ and $LO_{IFQ}$, respectively.

The output of the IF DUCs 53 $IF_I$ and $IF_Q$ are encoded by two ML-IFPWM power encoders 54, e.g., shown in FIG. 3. The generated pulse trains are $PWM_I$ and $PWM_Q$. Another set of digital up-converters mix $PWM_I$ and $PWM_Q$ with $LO_{RFI}$ {1,0,-1,0, . . . } and $LO_{RFQ}$ {0,1,0,-1, . . . }, respectively. The products are added by the combiner 55 to output $RF_{in}$ (i.e., $RF_{in} = PWM_I \cdot LO_{RFI} + PWM_Q \cdot LO_{RFQ}$) and then a mapper 57 converts the multi-level $RF_{in}$ into the control bits signal.

Usually, a (2M-1)-level pulse train needs M control bits, for instance, 2 bits for 3-level and 3 bits for 5-level IFPWM signal. The M control bits are binary switching signal SW(0:M-1) to control the switches (e.g., using GaN transistors) of the power amplifier (e.g., class-S PA) in 59. To fit the multi-bits input, the power amplifier can be configured in H-bridge for 3-level signal, or the paralleled H-bridge for 5 or more-level signal.

There can be also a feedback from the output of the power amplifier. The feedback couples a small amount of power back to the input for characterizing the nonlinearity introduced by the power amplifier. Before the power amplifier, a buffer driver 58 is required to synchronize the multi-bits input and also provide some amplification to reach the power amplifier's input power requirement. Within 59, a bandpass reconstruction filter (BPF) can also be included in the SMPA module for filtering the out-of-band quantization noise in order to transmit the clean analog $RF_{out}$, and, e.g., the BPF or another additional designed energy recycling block (e.g. broadband RF-DC rectifier) can recycle RF power associated with those undesired spectral components back to the SMPA DC supply. The $RF_{out}$ is suitable for transmission by an antenna. Other conventional transmitter and receiver components can also be used, e.g., an isolator to eliminate the effect of power reflections.

Non-Uniform Distribution Values for Power Coding Efficiency

Figure 6:
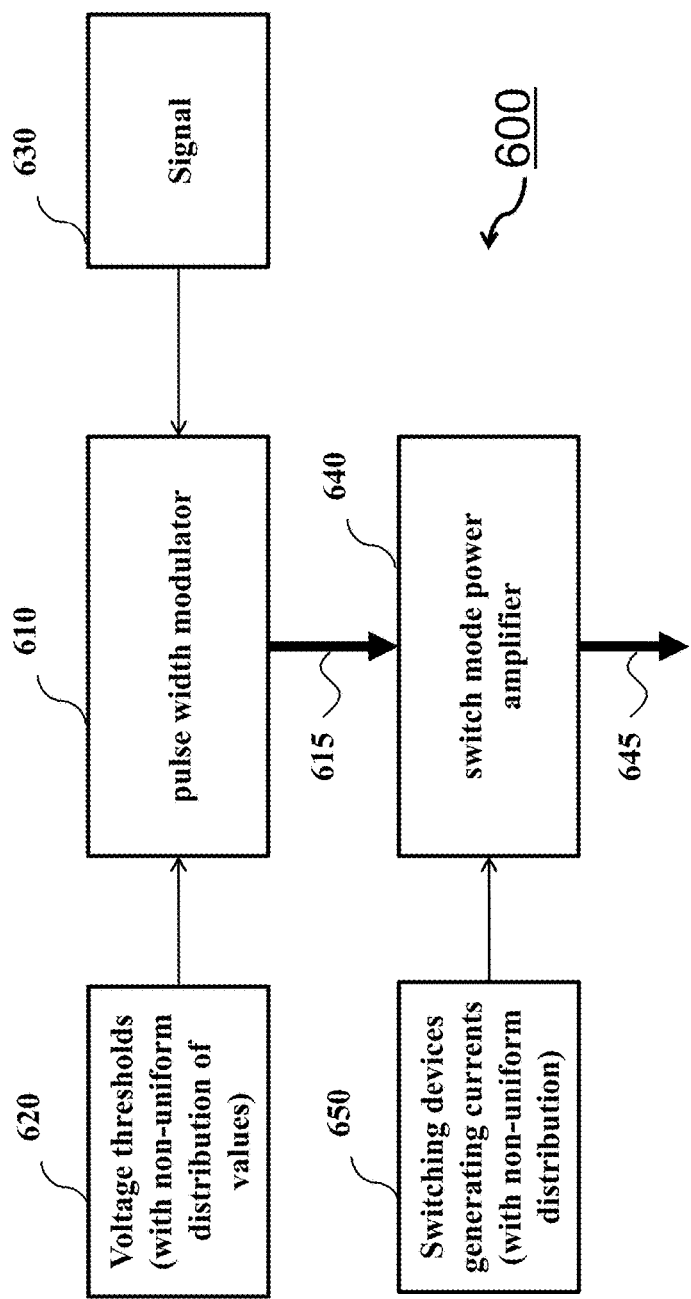
FIG. 6 is a block diagram of a power encoder according to some embodiments of the invention.

FIG. 6 shows a block diagram of a power encoder 600 according to some embodiments of the invention. The power encoder 600 includes a pulse width modulator 610 for modulating a signal 630 according to a set of voltage thresholds 620 having including at least two positive voltage thresholds to produce a pulse width modulated (PWM) signal 615. In one embodiment, the modulator is a radio frequency (RF) modulator, and the PWM signal is an RF pulse train. In alternative embodiment, the modulator is an intermediate frequency (IF) modulator, and the PWM signal is an IF pulse train.

The power encoder 600 also includes a switch mode power amplifier (SMPA) 640 for amplifying the PWM signal 615 to produce an output signal 645. The output signal 645 is produced by switching states of switching devices 650 of the SMPA according to amplitudes of the PWM signal. In various embodiments of the invention, at least one or combination of a distribution of values of the voltage thresholds 620 and a distribution of values of a current generated by different switching devices 650 are non-uniform.

Some embodiments of the invention are based on recognition that uniform distribution of values of the voltage thresholds used by a pulse width modulator for modulating a signal limits capability of modulator to compensate for non-linearity of the signal and high-frequency noise. Some embodiments based on further realization and corresponding justification that the power coding efficiency depends not only on statistical property of the signal, but also on ratio of positive or negative voltage thresholds. For example, in some embodiments, a ratio of two voltage thresholds is between 0.3 and 0.4. In one embodiment, the ratio is 0.35.

Figure 7:
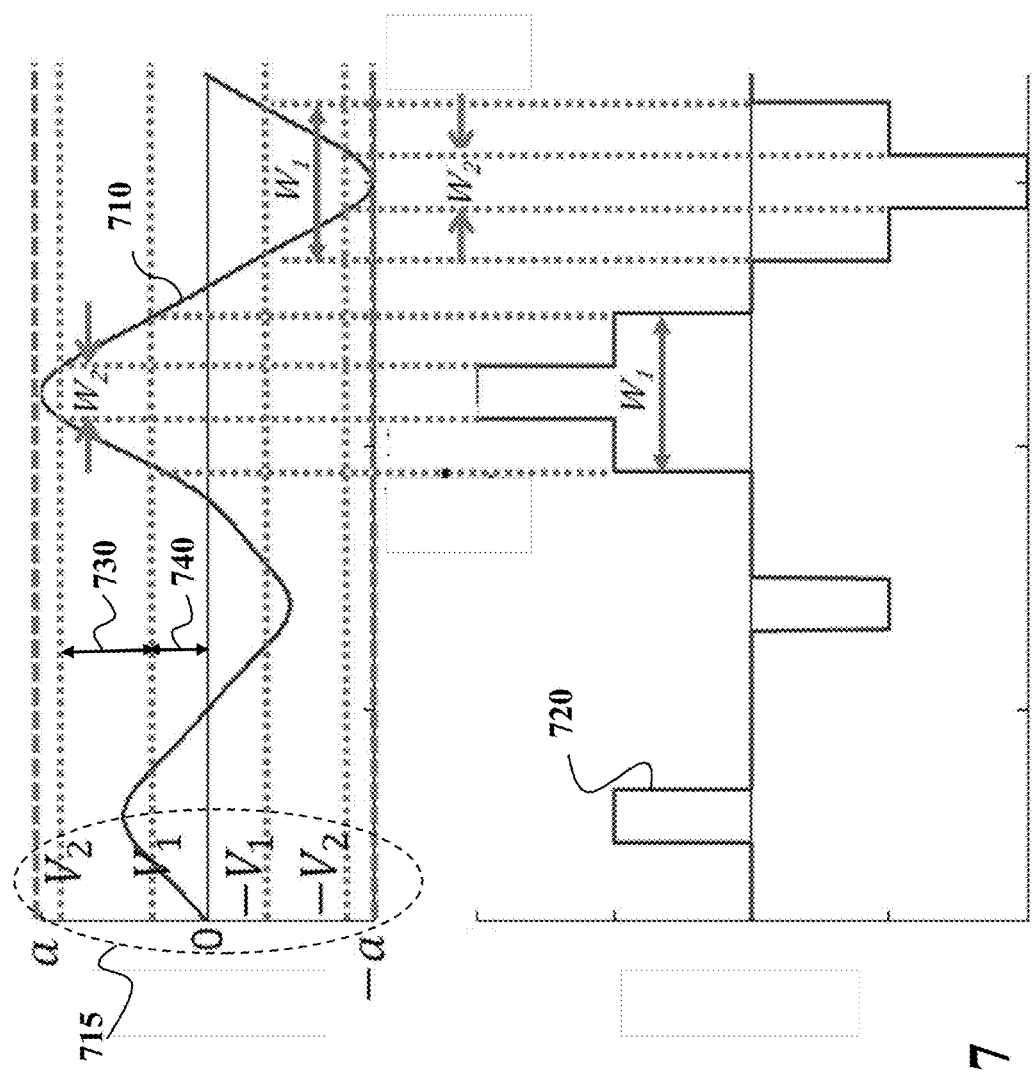
FIG. 7 is a schematic of a modulation of the signal with a set of voltage thresholds according to some embodiments of the invention.

FIG. 7 shows a schematic illustrating a modulation of the signal 710 with a set of voltage thresholds 715 including five values—$-V_2$, $-V_1$, $V_0$, $V_1$ and $V_2$ to produce a five-level PWM signal 720 according to some embodiments of the invention. As can be seen from FIG. 7, the selection of the values of the voltage thresholds governs the presence and the length, e.g., $W_1$ and $W_2$, of the constant amplitude values of the PWM signal 720.

In some embodiments of the invention, the distribution of the values of the voltage thresholds 715 is non-uniform. Specifically, the distance between neighboring voltage threshold varies. For example, for two positive thresholds, i.e., the first voltage threshold $V_1$ and the second voltage threshold $V_2$, the distance 740 between the values of the neighboring voltage thresholds $V_0$ and $V_1$ does not equal the distance 730 between values of the neighboring voltage thresholds $V_2$ and $V_1$. For example, a ratio $a_v=V_1/V_2$ can be between 0.3 and 0.4 inclusively, e.g., $a_v$=0.35.

Some embodiments of the invention are based on another recognition that, additionally or alternatively to the non-uniform distribution of voltage thresholds, a non-uniform distribution of values of a current generated by different switching devices of the SWPA for amplifying the modulated signal can also improve the efficiency of the power encoder. For example, in some embodiments, the modulated signal is a multi-level PWM signal and the ratio of the current generated for one level of the modulated signal to the current generated for the next level of the modulated signal is between 0.2 and 0.4 inclusively.

Figure 8:
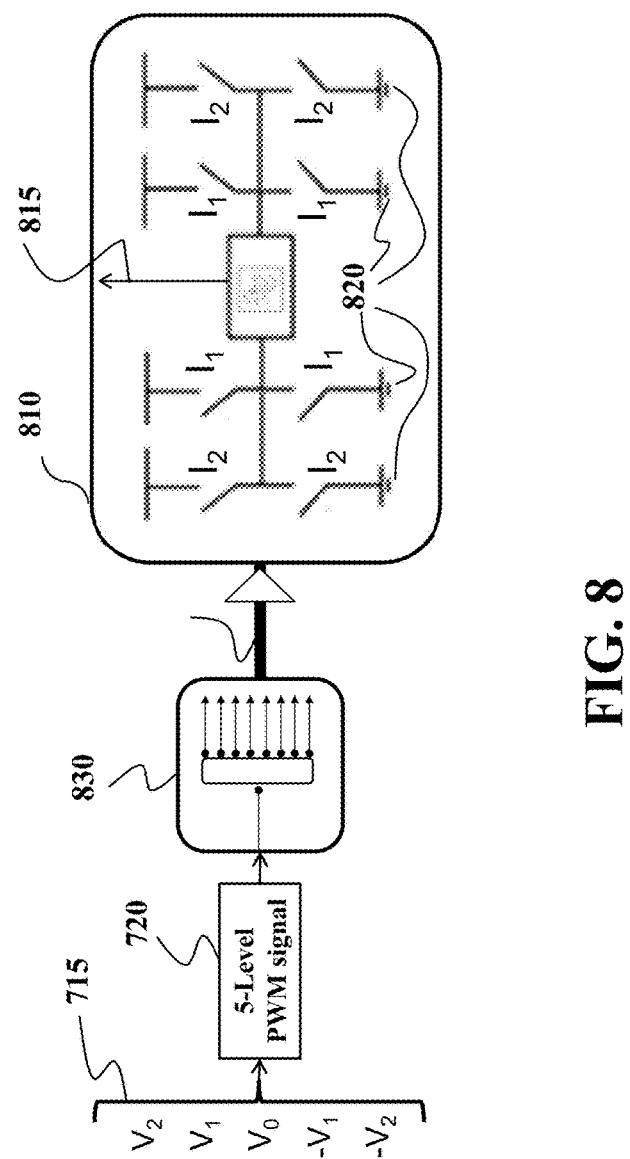
FIG. 8 is a block diagram of a power encoder for producing the amplified output signal according to some embodiments of the invention.

FIG. 8 shows a block diagram of the SMPA 810 for producing the amplified output signal 815 by switching states of switching devices, e.g., the switching devices 820, according to amplitudes of the PWM signal. In some embodiments, a number of switching devices in the SMPA 810 depends on a number of voltage thresholds in the set 715. For example, in one embodiment the PWM signal has (2n+1) levels, n is a positive natural number, wherein the set of thresholds includes n non-zero values of voltage thresholds, and the SMPA includes 2n switching devices with non-uniform total current capability for the n non-zero levels of the PWM signal.

The amplitudes of PWM signal 720 are converted by the mapper 830 into the control signal. For example, for the five-level PWM signal, the mapper 830 can include eight ON/OFF switches to map or transform the PWM signal into a control bits signal. To fit the multi-bits input, the power amplifier 810 can be configured in H-bridge for 3-level signal, or the paralleled H-bridge for 5 or more-level signal.

In some embodiments, a distribution of values of a current generated by different switching devices is non-uniform. For example, in some embodiments, the switching devices 820 are transistors having different dimensions to produce different currents. For example, the transistors can be GaN transistors with different width of the gates.

In one embodiment, the power amplifier includes 2n switching devices for the n non-zero levels of the PWM signal to produce $I_n$ current for each level, wherein a ratio $a_v=V_{n-1}/V_n$ and a ratio $a_i=I_{n-1}/(I_{n-1}+I_n)$ are between 0.2 and 0.4 inclusively. For example, the power amplifier includes a first switching device for generating a current with a first value $I_1$, such that the power amplifier produces $I_1$ current for the first level of the PWM signal and includes a second switching device for generating a current with a second value $I_2$, such that the power amplifier produces $I_1+I_2$ current for the second level of the PWM signal, wherein a ratio $a_i=I_1/(I_1+I_2)$ is between 0.2 and 0.4 inclusively.

Figure 9:
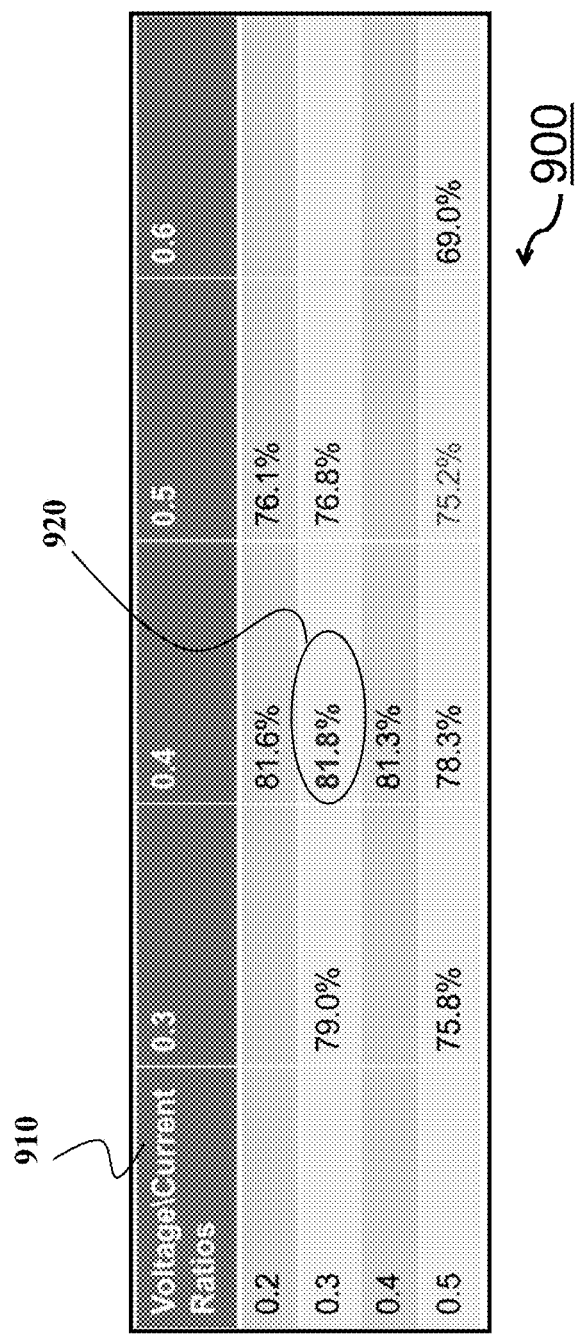
FIG. 9 is a table showing different combination of ratios of voltage thresholds and generated currents for different levels of the PWM signal according to some embodiments of the invention.

FIG. 9 shows a table with different combination of ratios 910 of voltage thresholds and generated currents for different levels of the PWM signal. According to this table, one embodiment improves the power coding efficiency with a combination 920 of non-uniform distributions of the values of the voltage thresholds and generated currents. The embodiment improves the power coding efficiency by more than 5%.

For example, in one embodiment, the set of threshold includes the first voltage threshold $V_1$ for the first level of the PWM signal and the second voltage threshold $V_2$ for the second level of the PWM signal, wherein a ratio $a_v=V_1/V_2$ is between 0.3 and 0.4 inclusively. Also, the power amplifier includes the first switching device for generating a current with the first value such that the power amplifier produces current for the first level of the PWM signal, wherein the power amplifier includes the second switching device for generating a current with the second value $I_2$, such that the power amplifier produces $I_1+I_2$ current for the second level of the PWM signal, wherein a ratio $a_i=I_1/(I_1+I_2)$ is between 0.2 and 0.4 inclusively.

Dynamic Updates for Power Codding Efficiency

For 3-level fixed threshold PWM, the theoretical power coding efficiency is:

$$\eta_{CODE} = \frac{\frac{1}{2}\int_0^1 x^2 f_x(x)dx}{\int_0^1 \left[1 - \frac{2}{\pi}\cos^{-1}\left(\frac{x}{4/\pi}\right)\right] f_x(x)dx}, \quad (1)$$

where x is the original baseband signal amplitude, $$f_x(x) = \frac{x}{\sigma^2} e^{-\frac{x^2}{2\sigma^2}}$$

is the PDF of x fitted by Rayleigh distribution.

For 5-level fixed threshold PWM, the theoretical power coding efficiency is:

$$\eta_{CODE} = \frac{\frac{1}{2}\int_0^1 x^2 f_x(x)dx}{\frac{1}{4}E\left[1 - \frac{2}{\pi}\sin^{-1}\left(\frac{V_1}{a}\right)\right] + \frac{3}{4}E_{\alpha>V_2}\left[1 - \frac{2}{\pi}\sin^{-1}\left(\frac{V_2}{a}\right)\right]}, \quad (2a)$$

$$a = \begin{cases} V_1 \dfrac{1}{\sqrt{1 - \left(\frac{\pi}{2}x\right)^2}}, & 0 \le x \le x_0 \\ V_1 \dfrac{\sqrt{1 + \alpha^2 + \frac{4}{\pi x}\sqrt{(1-\alpha^2)^2 + \left(\frac{\pi}{2}x\alpha\right)^2}}}{\alpha\sqrt{2^2 - \left(\frac{\pi}{2}x\right)^2}}, & x_0 < x \le \frac{4}{\pi} \end{cases} \quad (2b)$$

where x is the original baseband signal amplitude, $$f_x(x) = \frac{x}{\sigma^2} e^{-\frac{x^2}{2\sigma^2}}$$

is the PDF of x fitted by Rayleigh distribution, α is the pre-distorted amplitude, $V_1$ and $V_2$ are two thresholds ($V_1 < V_2$), their ratio $$\alpha = \frac{V_1}{V_2}, \text{ and } x_0 = \frac{2}{\pi}\sqrt{1-\alpha^2}.$$

In the Equation (1), $\eta_{CODE}$ is only associated with input signal's $f_x(x)$, therefore, any threshold value leads to the same power coding efficiency, which is around 46% for this LTE baseband signal. In the Equations (2a) and (2b), $\eta_{CODE}$ is not only related to the input signal's $f_x(x)$, but also the thresholds value ratio $\alpha$. And there exists an optimum solution: when $\alpha=0.3\sim0.4$, the power coding efficiency is maximized to around 77%. Furthermore, more analysis shows that, $\alpha=0.35$ can apply to almost all Rayleigh distributed signal patterns for five-level PWM as long as the fitted scale parameter of the distribution $\sigma=0.1, 0.2, \ldots, 0.9$, and that maximize power coding efficiency.

In some digital implementation of embodiments of the invention, the absolute values of two thresholds are selected not too large or too small in order to make the best of the sampling resolution and not degrade the linearity performance.

The modulated pulse width W of a 3-level PWM signal can be represented as, $$W(a) = \begin{cases} \frac{1}{2f_c}\left[1 - \frac{2}{\pi}\sin^{-1}\left(\frac{V}{a}\right)\right], & a \geq V \\ 0, & a < V \end{cases} \quad (3)$$

where $f_c$ is signal's carrier frequency, $\alpha$ is the instantaneous envelope in each period, and V is the threshold value in the set 715. For any PWM signal with steady state width W, whose fundamental harmonic's amplitude is $$x(a) = \frac{4}{\pi} \cdot \sin(\pi \cdot f_c \cdot W(a)). \quad (4)$$

Plugging Equation (3) into Equation (4) results in AM-AM function $$x(a) = \begin{cases} 0, & 0 \leq a < V \\ \frac{4}{\pi} \cdot \cos\left[\sin^{-1}\left(\frac{V}{a}\right)\right], & V \leq a \end{cases}. \quad (5)$$

Similar to 3-level case, the AM-AM function of 5-level fixed threshold PWM can be developed as $$x(a) = \begin{cases} 0, & 0 \leq a < V_1 \\ \frac{2}{\pi}\cos\left[\sin^{-1}\left(\frac{V_1}{a}\right)\right], & V_1 \leq a < V_2 \\ \frac{2}{\pi}\left\{\cos\left[\sin^{-1}\left(\frac{V_1}{a}\right)\right] + \cos\left[\sin^{-1}\left(\frac{V_2}{a}\right)\right]\right\}, & V_2 \leq a \end{cases} \quad (6)$$

This can be accordingly changed when non-uniform current distributions are used for switching devices, to linearize by pre-distortion.

In order to meet the stringent linearity requirement of modem wireless communications, the pre-distortion can be used to linearize the nonlinearity of PWM conversion. For 3-level PWM signal, the pre-distorted signal $\alpha$ can be $$a = \frac{V}{\sin\left[\cos^{-1}\left(\frac{x}{4/\pi}\right)\right]} = \frac{V}{\sqrt{1 - \left(\frac{x}{4/\pi}\right)^2}}, \quad (7)$$

For 5-level PWM signal, the pre-distorted signal $\alpha$ could be $$a = \begin{cases} V_1 g_1(x) = V_1 \dfrac{1}{\sqrt{1 - \left(\frac{\pi}{2}x\right)^2}}, & 0 \leq x \leq x_0 \\ V_1 g_2(x, \alpha) = V_1 \dfrac{\sqrt{1 + \alpha^2 + \frac{4}{\pi x}\sqrt{(1-\alpha^2)^2 + \left(\frac{\pi}{2}x\alpha\right)^2}}}{\alpha\sqrt{2^2 - \left(\frac{\pi}{2}x\right)^2}}, & x_0 < x \leq \frac{4}{\pi} \end{cases} \quad (8)$$

where $\alpha = \frac{V_1}{V_2}$, and $x_0 = \frac{2}{\pi}\cos(\sin^{-1}(\alpha)) = \frac{2}{\pi}\sqrt{1-\alpha^2}$.

Since both the in-phase (I) and quadrature (Q) components of the input signal, $x_I$ and $x_Q$, are normally distributed, the transmitted signal is a complex Gaussian variable. The envelope $x=\sqrt{x_I^2+x_Q^2}$, is Rayleigh distributed. The probability density function of the Rayleigh fitted input envelope signal is $$PDF \ f_x(x) = \frac{x}{\sigma^2}e^{-\frac{x^2}{2\sigma^2}}, \ CDF \ F_x(x) = 1 - e^{-\frac{x^2}{2\sigma^2}}.$$

The scale parameter $\sigma$ is calculated from $$\sqrt{\frac{2}{\pi}}E\{x\}.$$

For future computation convenience, define the partial moment as $$M_m(x) = \int_0^x t^m f_x(t)dt = (2\sigma^2)^{m/2}\left(\Gamma\left(1+\frac{m}{2}, 0\right) - \Gamma\left(1+\frac{m}{2}, \frac{x^2}{2\sigma^2}\right)\right), \quad (9)$$

where $\Gamma(z,\alpha)=\int_a^\infty t^{z-1}e^{-t}dt$ is the incomplete gamma function. From (9), determine $$M_1(x) = \sqrt{\frac{\pi\sigma^2}{2}}\ \text{erf}\left(\frac{x}{\sqrt{2\sigma^2}}\right) - xe^{-\frac{x^2}{2\sigma^2}}, \quad (10)$$

$$M_2(x) = 2\sigma^2 - (2\sigma^2 + x^2)e^{-\frac{x^2}{2\sigma^2}},$$

$$M_3(x) = 3\sqrt{\frac{\pi\sigma^6}{2}}\ \text{erf}\left(\frac{x}{\sqrt{2\sigma^2}}\right) - x(3\sigma^2 + x^2)e^{-\frac{x^2}{2\sigma^2}},$$

where the error function erf($\cdot$) is defined as $$\text{erf}(x) = \frac{2}{\sqrt{\pi}}\int_0^x e^{-t^2}\ dt.$$

The power coding efficiency function is the power ratio of the desired in-band over the whole band in frequency spectrum domain. For a modulated signal, the average power of the in-band signal $x_{PS}(t) = x \cos(2\pi f_c t)$ is $$P_s(x) = \frac{1}{2} E\{x^2\}. \tag{11}$$

The total signal power equals to the waveform mean square power in the time domain. For 3-level and 5-level, $$P_{tot\_3}(x) = E\{2f_{IF} W(t)\} = \tag{12}$$
$$E\left\{1 - \frac{2}{\pi}\sin^{-1}\left(\frac{V_{th}}{a}\right)\right\} \cdot \text{Prob}\{a \geq V_{th}\} = E\left\{1 - \frac{2}{\pi}\cos^{-1}\left(\frac{x}{4/\pi}\right)\right\}.$$

$$P_{tot\_5}(x) = \tag{13}$$
$$E\left\{\frac{1}{T}\int_0^T f(t)^2 dt\right\} = E\{2f_{IF}[W_2(t) \cdot 1^2(W_1(t) - W_2(t)) \cdot 0.5^2]\} =$$
$$\frac{1}{4}E\left\{1 - \frac{2}{\pi}\sin^{-1}\left(\frac{V_1}{a}\right)\right\} + \frac{3}{4}E\left\{1 - \frac{2}{\pi}\sin^{-1}\left(\frac{V_2}{a}\right)\right\} \cdot \text{Prob}\{a > V_2\}.$$

The general form of the average coding efficiency is $$\eta_{CODE} = \frac{P_s(x)}{P_{tot\_3}(x)} = \frac{\frac{1}{2}\int_0^1 x^2 f_x(x) dx}{\int_0^1 \left[1 - \frac{2}{\pi}\cos^{-1}\left(\frac{x}{4/\pi}\right)\right] f_x(x) dx}. \tag{14}$$

$$\eta_{CODE} = \frac{P_s(x)}{P_{tot\_5}(x)} = \frac{\frac{1}{2}\int_0^1 x^2 f_x(x) dx}{\frac{1}{4}E\left\{1 - \frac{2}{\pi}\sin^{-1}\left(\frac{V_1}{a}\right)\right\} + \frac{3}{4}E\left\{1 - \frac{2}{\pi}\sin^{-1}\left(\frac{V_2}{a}\right)\right\} \cdot \text{Prob}\{a > V_2\}}, \tag{15}$$

where $\alpha$ is expressed in (8),

The $P_{tot\_5}(x)$ can be written as $$\frac{1}{4}E\left[1 - \frac{2}{\pi}\sin^{-1}\left(\frac{V_1}{a}\right)\right] + \frac{3}{4}\underset{a>V_2}{E}\left[1 - \frac{2}{\pi}\sin^{-1}\left(\frac{V_2}{a}\right)\right] = \tag{16}$$
$$\frac{1}{4}\int_0^{x_0}\left(1 - \frac{2}{\pi}\sin^{-1}\left(\frac{1}{g_1(x)}\right)\right) f_x(x) dx +$$
$$\frac{1}{4}\int_{x_0}^{\frac{4}{\pi}}\left(1 - \frac{2}{\pi}\sin^{-1}\left(\frac{1}{g_2(x,\alpha)}\right)\right) f_x(x) dx +$$
$$\frac{3}{4}\int_{x_0}^{\frac{4}{\pi}}\left(1 - \frac{2}{\pi}\sin^{-1}\left(\frac{1}{\alpha g_2(x,\alpha)}\right)\right) f_x(x) dx.$$

Based on Equation (14), the power coding efficiency of 3-level PWM signal depends only on the signal statistical property (i.e. $f_x(x)$). For 5-level PWM signal, in Equations (15) and (16), besides the signal statistical property $f_x(x)$, the power coding efficiency is also associated with another parameter, a ratio $\alpha$ of values of voltage thresholds. Usually $f_x(x)$ is given from the specific input signal. The ratio $\alpha$ is a design parameter that can be optimized to minimize the $P_{tot\_5}(x)$, which lead to the maximum power coding efficiency according to Equation (15).

Some embodiments perform several approximations of determination of the coding efficiency as follows:

Consider $$1 - \frac{2}{\pi}\sin^{-1}\left(\frac{1}{g_1(x)}\right) = 1 - \frac{2}{\pi}\sin^{-1}\left(\sqrt{1 - \left(\frac{\pi}{2}x\right)^2}\right)$$

in the first term of metric (16), the $3^{rd}$ order Taylor series expansion (at x=0) is given as:

$$\text{taylor} = x + \frac{1}{6}\left(\frac{\pi}{2}x\right)^3.$$

Therefore, the first term of metric (16) can be approximated as $$\frac{1}{4}\int_0^{x_0}\left(x + \frac{1}{6}\left(\frac{\pi}{2}x\right)^3\right) f_x(x) dx = \frac{1}{4}M_1(x_0) + \frac{1}{3}\left(\frac{\pi}{4}\right)^3 M_3(x_0). \tag{17}$$

Consider $$1 - \frac{2}{\pi}\sin^{-1}\frac{1}{g_2(x,\alpha)}$$

in the second term of metric (16), the $3^{rd}$ order Taylor series expansion (at x=0) is given as:

$$\text{taylor} = 1 - \frac{2}{\pi}\sin^{-1}(\alpha) + \frac{\alpha}{2x_0}(x - x_0)^2 - \frac{\alpha^3}{2x_0^2}(x - x_0)^3.$$

Therefore, the second term of metric (16) can be approximated as $$\frac{1}{4}\int_{x_0}^{\frac{4}{\pi}}\left(1 - \frac{2}{\pi}\sin^{-1}\left(\frac{1}{g_2(x,\alpha)}\right)\right) f_x(x) dx = \tag{18}$$
$$\frac{1}{4}\left(1 - \frac{2}{\pi}\sin^{-1}(\alpha) + \frac{\alpha x_0}{2}\right)(1 - F_x(x_0)) -$$
$$\frac{\alpha}{4}(M_1(4/\pi) - M_1(x_0)) + \frac{\alpha}{8x_0}(M_2(4/\pi) - M_2(x_0)).$$

Consider $$1 - \frac{2}{\pi}\sin^{-1}\left(\frac{1}{\alpha g_2(x,\alpha)}\right)$$

in the last term of metric (16), the $3^{rd}$ order Taylor series expansion (at x=0) is given as:

$$\text{taylor} = (x - x_0) - \frac{\alpha^2}{2x_0}(x - x_0)^2 + \frac{(1 - \alpha^2 + 3\alpha^4)}{6x_0^2}(x - x_0)^3.$$

Therefore, the last term of metric (16) can be approximated as $$\frac{3}{4}\int_{x_0}^{\frac{4}{\pi}}\left(1-\frac{2}{\pi}\sin^{-1}\left(\frac{1}{\alpha g_2(x,\alpha)}\right)\right)f_x(x)dx = \quad (19)$$

$$-x_0\frac{9}{8}(1+\alpha^4)(1-F_x(x_0))+\frac{3}{8}(3+\alpha^2+3\alpha^4)(M_1(4/\pi)-M_1(x_0)))-$$

$$\frac{1+2\alpha^2+3\alpha^4}{8x_0}(M_2(4/\pi)-M_2(x_0))+\frac{1-\alpha^2+3\alpha^4}{8x_0^2}$$

$$(M_3(4/\pi)-M_3(x_0)).$$

The approximated metric can also be formed by plugging (17), (18), and (19) into (16), to receive $$\min_\alpha \frac{1}{4}M_1(x_0)+\frac{1}{3}\left(\frac{\pi}{4}\right)^3 M_3(x_0)+ \quad (20)$$

$$\frac{1}{4}\left(1-\frac{2}{\pi}\sin^{-1}(\alpha)+\frac{\alpha x_0}{2}\right)(1-F_x(x_0))-\frac{\alpha}{4}(M_1(4/\pi)-M_1(x_0))+$$

$$\frac{\alpha}{8x_0}(M_2(4/\pi)-M_2(x_0))-\frac{3x_0}{4}\frac{2+\alpha^2}{2}(1-F_x(x_0))+$$

$$\frac{3(1+\alpha^2)}{4}(M_1(4/\pi)-M_1(x_0))-\frac{3\alpha^2}{8x_0}(M_2(4/\pi)-M_2(x_0)),$$

where $M_1(\cdot)$, $M_2(\cdot)$ and $M_3(\cdot)$ are expressed in (10).

Computation shows that with ratio $\alpha=0.3\sim 0.4$ there is a minimum solution of (20). Moreover, further computation demonstrates that, this optimum spot exists for all $\sigma=0.1, 0.2, \ldots, 0.9$. Therefore, the ratio $\alpha=0.35$ can be used for various scenarios for 5-level fixed threshold PWM. Once the optimized thresholds ratio is determined, some embodiments select set of voltage threshold values for implementing the optimum LUT pre-distortion unit and multi-level power encoder.

Figure 10:
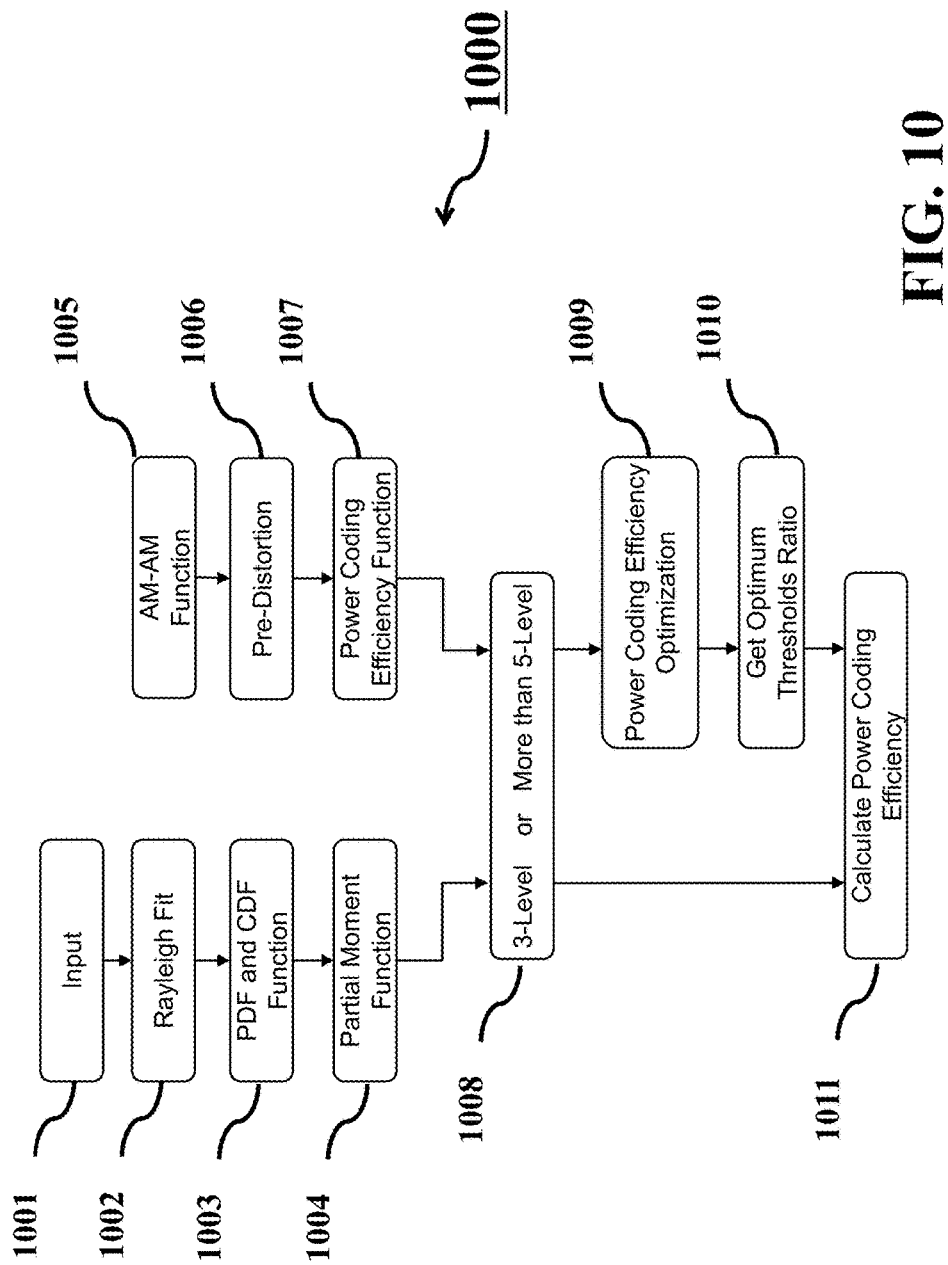
FIG. 10 is a flow chart of a method for dynamically selecting the set of voltage thresholds according to some embodiments of the invention.

FIG. 10 shows a flow chart of a method for dynamically selecting the set of voltage thresholds according to some embodiments of the invention. The input signal data 1001 is fitted 1002 by Rayleigh distribution to determine the scale parameter $\sigma$. The probability density function (PDF) and the cumulative distribution function (CDF) are determined 1003 using the scale parameter $\sigma$. Next, the partial moment functions are calculated 1004 using the PDF.

The fixed threshold PWM power encoder is modeled 1005 by the AM-AM function. For example, pre-distortion block is modeled 1006 by the inverse function of the AM-AM function. The theoretical power coding efficiency target function is determined 1007.

In some embodiments, the method splits 1008 based on quantization levels of the PWM signal. For 3-level case, the power coding efficiency 1011 can be directly calculated. For 5-level case, the target function 1007 is optimized by minimizing the total signal power 1009. The optimum thresholds ratio 1010 is determined to produce the 5 or more-level power coding efficiency 1011. In one embodiment, the processor determines, for each frame of the distorted input signal, the set of fixed threshold, the transformation function, and the LUT.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A power encoder, comprising:
    a pulse width modulator for modulating a signal according to a set of thresholds including at least two positive voltage thresholds to produce a pulse width modulated (PWM) signal; and
    a switch mode power amplifier for amplifying the PWM signal by switching states of switching devices according to amplitudes of the PWM signal, wherein at least one or combination of a distribution of values of the voltage thresholds in the set of thresholds and a distribution of values of currents generated by the switching devices are non-uniform such that a distance between neighboring voltages in the set of thresholds and a distance between neighboring currents in the generated currents vary, wherein the set of thresholds includes a first voltage threshold and a second voltage threshold, wherein a ratio of the first voltage threshold and the second voltage threshold is between 0.3 and 0.4.

2. The power encoder of claim 1, wherein the ratio is 0.35.

3. The power encoder of claim 1, wherein the switching devices of the power amplifier include transistors having different dimensions to produce different currents.

4. The power encoder of claim 1, wherein the PWM signal has (2n+1) levels, n is a positive natural number, wherein the set of thresholds includes n non-zero values of voltage thresholds, and wherein the power amplifier includes 2n switching devices with non-uniform total current capability for the n non-zero levels of the PWM signal.

5. The power encoder of claim 1, wherein the set of thresholds includes a first voltage threshold $V_1$ for a first level of the PWM signal and a second voltage threshold $V_2$ for a second level of the PWM signal, wherein a ratio $a_v=V_1/V_2$ is between 0.3 and 0.4 inclusively; and wherein the power amplifier includes a first switching device for generating a current with a first value $I_1$, such that the power amplifier produces $I_1$ current for the first level of the PWM signal, wherein the power amplifier includes a second switching device for generating a current with a second value $I_2$, such that the power amplifier produces $I_1+I_2$ current for the second level of the PWM signal, wherein a ratio $a_i=I_1/(I_1+I_2)$ is between 0.2 and 0.4 inclusively.

6. The power encoder of claim 1, wherein the PWM signal has (2n+1) levels, n is a positive natural number, wherein the set of thresholds includes n non-zero values $V_n$ of the voltage thresholds, and wherein the power amplifier includes 2n switching devices for the n non-zero levels of the PWM signal to produce $I_n$ current for each level, wherein a ratio $a_v=V_{n-1}/V_n$ and a ratio $a_i=I_{n-1}/(I_{n-1}+I_n)$ is between 0.2 and 0.4 inclusively.

7. The power encoder of claim 1, further comprising:
    an amplitude-phase splitter for splitting an input signal into an envelope signal and a phase modulated signal;
    a pre-distortion unit for distorting the envelope signal using a look-up table (LUT) to produce a distorted envelope signal, wherein the look-up table stores a non-linear mapping of a transformation function;
    a digital converter for combining the distorted envelope signal with the phase modulated signal to produce a distorted input signal, wherein the signal is the distorted input signal, such that the modulator modulates the distorted input signal according to a transformation function with the set of thresholds to produce the PWM signal, wherein a relationship between the distorted input signal and the PWM signal is non-linear.

8. The power encoder of claim 7, wherein the modulator is a radio frequency (RF) modulator, and the digital converter up-converts the distorted envelope signal and the phase modulated signal with an RF carrier signal, such that the PWM signal is an RF pulse train.

9. The power encoder of claim 7, wherein the modulator is an intermediate frequency (IF) modulator, and the digital converter up-converts the distorted envelope signal and the phase modulated signal with an IF carrier signal, such that the PWM signal is an IF pulse train.

10. The power encoder of claim 9, further comprising:
a second digital up-converter for converting the IF pulse train to a radio frequency (RF) pulse train and for submitting the RF pulse train to the switch mode power amplifier.

11. The power encoder of claim 7, wherein a value of each threshold is based on a probability density function (PDF) of a portion of the input signal.

12. The power encoder of claim 11, further comprising
a memory for storing a frame of the distorted input signal;
a processor for determining the PDF from data in the frame, for integrating the PDF to generate a curve of a cumulative distribution function (CDF), and for selecting values of each fixed threshold based on the curve.

13. The power encoder of claim 12, wherein the processor determines, for each frame of the distorted input signal, the set of fixed thresholds, the transformation function, and the LUT.

14. A method for power encoding, comprising
modulating a signal according to a set of thresholds including at least two positive voltage thresholds to produce a pulse width modulated (PWM) signal; and
amplifying the PWM signal by switching states of switching devices according to amplitudes of the PWM signal, wherein at least one or combination of a distribution of values of the voltage thresholds in the set of thresholds and a distribution of values of currents generated by the switching devices are non-uniform such that a distance between neighboring voltages in the set of thresholds and a distance between neighboring currents in the generated currents vary, wherein the set of thresholds includes a first voltage threshold V1 for a first level of the PWM signal and a second voltage threshold V2 for a second level of the PWM signal, wherein a ratio $av=V1/V2$ is between 0.3 and 0.4 inclusively; and wherein the amplifying is performed with a power amplifier including a first switching device for generating a current with a first value I1, such that the power amplifier produces I1 current for the first level of the PWM signal, and a second switching device for generating a current with a second value I2, such that the power amplifier produces I1+I2 current for the second level of the PWM signal, wherein a ratio $ai=I1/(I1+I2)$ is between 0.2 and 0.4 inclusively.

15. The method of claim 14, wherein the set of thresholds includes a first voltage threshold and a second voltage threshold, wherein a ratio of the first voltage threshold and the second voltage threshold is between 0.3 and 0.4.

16. The method of claim 15, wherein the ratio is 0.35.

17. The method of claim 15, wherein the amplifying is performed with transistors having different dimensions to produce different currents.

18. The method of claim 14, wherein the PWM signal is an intermediate frequency (IF) pulse train, further comprising:
converting the IF pulse train to a radio frequency (RF) pulse train for the amplifying.

19. A power encoder, comprising:
a pulse width modulator for modulating a signal according to a set of thresholds including at least two positive voltage thresholds to produce a pulse width modulated (PWM) signal; and
a switch mode power amplifier for amplifying the PWM signal by switching states of switching devices according to amplitudes of the PWM signal, wherein at least one or combination of a distribution of values of the voltage thresholds in the set of thresholds and a distribution of values of currents generated by the switching devices are non-uniform such that a distance between neighboring voltages in the set of thresholds and a distance between neighboring currents in the generated currents vary, wherein the PWM signal has (2n+1) levels, n is a positive natural number, wherein the set of thresholds includes n non-zero values of voltage thresholds, and wherein the power amplifier includes 2n switching devices with non-uniform current capability for the n non-zero levels of the PWM signal.

20. A power encoder, comprising:
a pulse width modulator for modulating a signal according to a set of thresholds including at least two positive voltage thresholds to produce a pulse width modulated (PWM) signal;
a switch mode power amplifier for amplifying the PWM signal by switching states of switching devices according to amplitudes of the PWM signal, wherein at least one or combination of a distribution of values of the voltage thresholds in the set of thresholds and a distribution of values of currents generated by the switching devices are non-uniform such that a distance between neighboring voltages in the set of thresholds and a distance between neighboring currents in the generated currents vary;
an amplitude-phase splitter for splitting an input signal into an envelope signal and a phase modulated signal;
a pre-distortion unit for distorting the envelope signal using a look-up table (LUT) to produce a distorted envelope signal, wherein the look-up table stores a non-linear mapping of a transformation function; and
a digital converter for combining the distorted envelope signal with the phase modulated signal to produce a distorted input signal, wherein the signal is the distorted input signal, such that the modulator modulates the distorted input signal according to a transformation function with the set of thresholds to produce the PWM signal, wherein a relationship between the distorted input signal and the PWM signal is non-linear.

* * * * *